(12) United States Patent
Cao et al.

(10) Patent No.: US 10,403,510 B2
(45) Date of Patent: Sep. 3, 2019

(54) METHOD OF FABRICATING A CARRIER-LESS SILICON INTERPOSER USING PHOTO PATTERNED POLYMER AS SUBSTRATE

(71) Applicant: Invensas Corporation, San Jose, CA (US)

(72) Inventors: Andrew Cao, Fremont, CA (US); Michael Newman, Fort Collins, CO (US)

(73) Assignee: Invensas Corporation, San Jose, CA (US)

( * ) Notice: Subject to any disclaimer, the term of this patent is extended or adjusted under 35 U.S.C. 154(b) by 170 days.

(21) Appl. No.: 15/626,577

(22) Filed: Jun. 19, 2017

(65) Prior Publication Data

US 2017/0294321 A1    Oct. 12, 2017

Related U.S. Application Data

(62) Division of application No. 14/096,387, filed on Dec. 4, 2013, now Pat. No. 9,691,693.

(51) Int. Cl.
*H01L 21/00* (2006.01)
*H01L 21/48* (2006.01)
(Continued)

(52) U.S. Cl.
CPC ........ *H01L 21/4853* (2013.01); *H01L 21/486* (2013.01); *H01L 23/13* (2013.01);
(Continued)

(58) Field of Classification Search
CPC ... H01L 21/4853; H01L 21/486; H01L 21/56; H01L 21/79698; H01L 23/49827;
(Continued)

(56) References Cited

U.S. PATENT DOCUMENTS

| 5,847,936 A | 12/1998 | Forehand et al. |
| 6,285,079 B1 | 9/2001 | Kunikiyo |

(Continued)

FOREIGN PATENT DOCUMENTS

| DE | 19904258 A1 | 12/1999 |
| WO | 2013172814 A1 | 11/2013 |
| WO | 2014066153 A1 | 5/2014 |

OTHER PUBLICATIONS

International Search Report and Written Opinion for PCT Application No. PCT/US2014/018057, dated May 8, 2014.

(Continued)

*Primary Examiner* — Nikolay K Yushin

(57) ABSTRACT

A component, e.g., interposer has first and second opposite sides, conductive elements at the first side and terminals at the second side. The terminals can connect with another component, for example. A first element at the first side can comprise a first material having a thermal expansion coefficient less than 10 ppm/° C., and a second element at the second side can comprise a plurality of insulated structures separated from one another by at least one gap. Conductive structure extends through at least one insulated structure and is electrically coupled with the terminals and the conductive elements. The at least one gap can reduce mechanical stress in connections between the terminals and another component.

2 Claims, 9 Drawing Sheets

(51) Int. Cl.
*H01L 23/498* (2006.01)
*H01L 23/00* (2006.01)
*H01L 25/065* (2006.01)
*H01L 25/16* (2006.01)
*H01L 23/14* (2006.01)
*H01L 23/13* (2006.01)

(52) U.S. Cl.
CPC ...... *H01L 23/147* (2013.01); *H01L 23/49811* (2013.01); *H01L 23/49827* (2013.01); *H01L 24/02* (2013.01); *H01L 25/0657* (2013.01); *H01L 25/16* (2013.01); *H01L 23/49816* (2013.01); *H01L 23/562* (2013.01); *H01L 24/05* (2013.01); *H01L 24/13* (2013.01); *H01L 24/16* (2013.01); *H01L 24/17* (2013.01); *H01L 24/48* (2013.01); *H01L 2224/0231* (2013.01); *H01L 2224/0237* (2013.01); *H01L 2224/02372* (2013.01); *H01L 2224/0401* (2013.01); *H01L 2224/05569* (2013.01); *H01L 2224/05624* (2013.01); *H01L 2224/05647* (2013.01); *H01L 2224/05655* (2013.01); *H01L 2224/05664* (2013.01); *H01L 2224/131* (2013.01); *H01L 2224/13024* (2013.01); *H01L 2224/13109* (2013.01); *H01L 2224/13111* (2013.01); *H01L 2224/16145* (2013.01); *H01L 2224/16225* (2013.01); *H01L 2224/16227* (2013.01); *H01L 2224/17181* (2013.01); *H01L 2224/48145* (2013.01); *H01L 2224/48227* (2013.01); *H01L 2224/73257* (2013.01); *H01L 2224/81424* (2013.01); *H01L 2224/81447* (2013.01); *H01L 2224/81455* (2013.01); *H01L 2224/81464* (2013.01); *H01L 2924/00014* (2013.01); *H01L 2924/12042* (2013.01)

(58) Field of Classification Search
CPC ............. H01L 23/147; H01L 23/49811; H01L 23/562; H01L 23/49816; H01L 24/02; H01L 24/05; H01L 24/13; H01L 24/16; H01L 24/17; H01L 24/48; H01L 25/0657; H01L 25/16; H01L 25/105; H01L 25/043; H01L 2224/05569; H01L 2224/0237; H01L 2224/0231; H01L 2224/02372; H01L 2224/0401; H01L 2224/05624; H01L 2224/05647; H01L 2224/05655; H01L 2224/05664; H01L 2224/13024; H01L 2224/131; H01L 2224/13109; H01L 2224/13111; H01L 2224/16145; H01L 2224/16227; H01L 2224/17181; H01L 2224/48145; H01L 2224/48227; H01L 2224/73257; H01L 2224/81424; H01L 2224/81447; H01L 2224/81455; H01L 2224/81464; H01L 2224/16225; H01L 2224/45099; H01L 2924/00014; H01L 2924/12042; H01L 2924/00; H01L 2924/014; H01L 2924/00012
See application file for complete search history.

(56) References Cited

U.S. PATENT DOCUMENTS

| | | |
|---|---|---|
| 6,391,220 B1 | 5/2002 | Zhang et al. |
| 6,462,427 B2 | 10/2002 | Sakayama et al. |
| 6,610,934 B2 | 8/2003 | Yamaguchi et al. |
| 6,711,813 B1 | 3/2004 | Beyne et al. |
| 6,747,350 B1 | 6/2004 | Lin et al. |
| 6,879,034 B1 | 4/2005 | Yang et al. |
| 7,057,284 B2 | 6/2006 | Chauhan et al. |
| 7,084,487 B1 | 8/2006 | Conn |
| 7,193,311 B2 | 3/2007 | Ogawa et al. |
| 7,208,335 B2 | 4/2007 | Boon et al. |
| 7,235,477 B2 | 6/2007 | Ogawa |
| 7,329,563 B2 | 2/2008 | Lo et al. |
| 7,791,199 B2 | 7/2010 | Grinman et al. |
| 7,882,628 B2 | 2/2011 | Muthukumar et al. |
| 7,902,661 B2 | 3/2011 | Smeys et al. |
| 8,125,065 B2 | 2/2012 | Lee |
| 8,198,724 B1 | 6/2012 | Wu et al. |
| 8,245,392 B2 | 8/2012 | Antesberger et al. |
| 8,349,276 B2 * | 1/2013 | Pamula ............... B01F 13/0071 204/600 |
| 8,405,229 B2 | 3/2013 | Antesberger et al. |
| 8,441,111 B2 | 5/2013 | Crisp et al. |
| 8,486,758 B2 | 7/2013 | Oganesian et al. |
| 8,637,968 B2 | 1/2014 | Haba et al. |
| 8,674,514 B2 | 3/2014 | Arai |
| 8,741,766 B2 | 6/2014 | Pendse |
| 8,907,500 B2 | 12/2014 | Haba et al. |
| 8,952,516 B2 | 2/2015 | Zohni et al. |
| 8,963,335 B2 | 2/2015 | Woychik et al. |
| 8,978,247 B2 | 3/2015 | Yang et al. |
| 9,024,205 B2 | 5/2015 | Uzoh |
| 9,105,483 B2 | 8/2015 | Chau et al. |
| 9,237,648 B2 | 1/2016 | Newman et al. |
| 9,257,396 B2 | 2/2016 | Uzoh |
| 9,379,089 B2 | 6/2016 | Yang et al. |
| 9,406,596 B2 | 8/2016 | Chen |
| 9,437,536 B1 | 9/2016 | Wang et al. |
| 2004/0080036 A1 | 4/2004 | Chang et al. |
| 2006/0194331 A1 * | 8/2006 | Pamula ............... B01F 13/0071 436/150 |
| 2012/0319295 A1 | 12/2012 | Chi et al. |
| 2013/0127054 A1 | 5/2013 | Muthukumar et al. |
| 2016/0300817 A1 | 10/2016 | Do et al. |
| 2016/0329267 A1 | 11/2016 | Huang et al. |

OTHER PUBLICATIONS

International Search Report and Written Opinion for PCT Application No. PCT/US2014/067496, dated Feb. 18, 2015.
International Search Report and Written Opinion for PCT Application No. PCT/US2016/031207, dated Jul. 21, 2016.
International Search Report and Written Opinion for PCT Application No. PCT/US2016/031259, dated Jul. 21, 2016.
U.S. Appl. No. 62/159,136, filed May 8, 2015.

* cited by examiner

METHOD OF FABRICATING A CARRIER-LESS SILICON INTERPOSER USING PHOTO PATTERNED POLYMER AS SUBSTRATE

CROSS-REFERENCE TO RELATED APPLICATION(S)

This application is a divisional of co-pending U.S. application Ser. No. 14/096,387, filed Dec. 4, 2013, the disclosure of which is incorporated herein by reference in its entirety.

BACKGROUND OF THE INVENTION

The present invention relates to packaging of microelectronic devices, especially the packaging of semiconductor devices.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 micron (μm) thick. The bond pads could include a single layer or multiple layers of metal. The size of the bond pads will vary with the device type but will typically measure tens to hundreds of microns on a side.

An interposer can be used to provide electrical connections between microelectronic elements such as one or more unpackaged or packaged semiconductor chips with one another, or between one or more unpackaged or packaged semiconductor chips and other components such as an integrated passives on chip ("IPOC") having passive circuit elements thereon, discrete passive devices, e.g., capacitors, resistors, or inductors or a combination of the same, without limitation. An interposer can couple such chip or plurality of chips with other structure such as a circuit panel.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in interposer structure and fabrication, further improvements can be made to enhance the processes for making interposers and the structures which can result from such processes.

SUMMARY OF THE INVENTION

According to an aspect of the invention, a component having first and second opposite sides, includes a first element and a second element. The first element has a first surface coincident with or adjacent to the first side of the component, and a second surface opposite the first surface. The first element comprises a first material having a coefficient of thermal expansion of less than 10 ppm/° C.

A second element is coupled to the second surface of the first element and has a surface coincident with or adjacent to the second side of the component. The second element comprises electrically insulated structures formed of at least one second material different from the first material. Each of the insulated structures is at least partially separated from one another by at least one gap extending from the surface of the second element towards the first element. The component further includes a plurality of conductive elements at the first side, and a plurality of terminals at the second side. The terminals can be configured for connection with a plurality of corresponding contacts of another component external to the component. Conductive structure electrically couples the plurality of terminals with the plurality of conductive elements, such conductive structure including at least one electrically conductive interconnect extending through at least one of the insulated structures towards the first element.

In a method of fabricating a component according to an embodiment of the invention, terminals and conductive structure can be formed extending through the insulated structures.

The at least one gap can be configured to reduce stress to the connections between terminals of the second element and the another component connected thereto. In a particular example, the insulated structures may define a plurality of the gaps, and the gaps may define a plurality of islands fully separated from one another by the gaps, each island including at least one insulated structure. Typically, such gaps are filled with an insulating material, which in some cases can be a compliant material, an elastomer, silicone, spin-on-glass material, or in a specific example, can be Polydimethylsiloxane (PDMS).

In a particular example, the component may further include connector elements which comprise the second material. The connector elements can connect respective adjacent insulated structures with one another, such connector elements extending between edges of adjacent insulated structures of the plurality of insulated structures and having cross-sectional area different from such adjacent insulated structures.

In an example, one or more of the plurality of islands has a substantially rectangular cross section in the first direction. In an example, the islands or gaps can be disposed in a grid pattern.

In an example, two or more of the respective areas have surfaces which are coplanar with one another at the surface of the component.

In an example, the second element can include a continuous portion comprising a plurality of the insulated structures which are integral to the continuous portion, and the insulated structures together with the gaps may define a tessellated pattern.

DETAILED DESCRIPTION OF THE INVENTION

Figure 1:
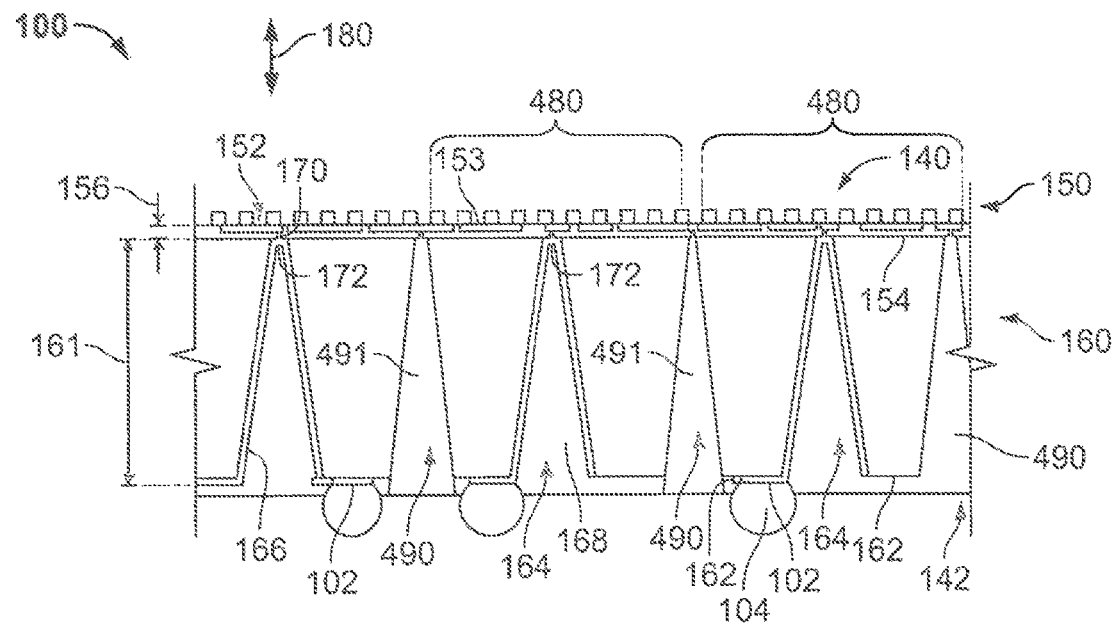
FIG. 1 is a sectional view illustrating a component according to an embodiment of the invention.
Figure 2A:
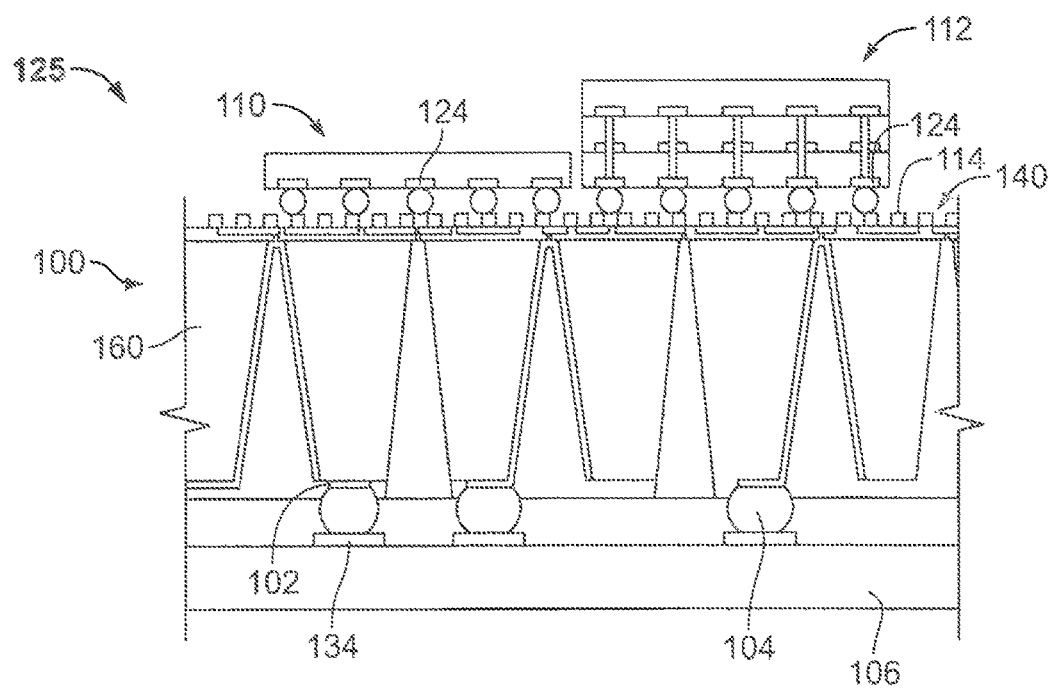
FIG. 2A is a sectional view illustrating a microelectronic assembly including a component according to an embodiment of the invention.

A component 100 according to an embodiment of the invention is illustrated with respect to FIGS. 1, 2A-C, and 3A-C. In a particular example, as seen in FIG. 1, the component 100 can be an interposer. In one example, the component or interposer may include active or passive circuit elements or both types which in some cases include portions formed in active semiconductor regions of the component. Semiconductor devices such as transistors, diodes, and/or other devices are among the types of devices which may be provided in the component. Specifically, the component may comprise a first element 150 which has active semiconductor device regions, dielectric regions, and wiring patterns thereon, and active or passive circuit elements can be provided in the first element 150. FIG. 2A illustrates an example in which the interposer 100 is assembled and electrically connected with a first microelectronic element 110. In a particular example, the interposer 100 may also be electrically connected with a second microelectronic element 112, and possibly with even more microelectronic elements (not shown). In one example as seen in FIG. 2A, the interposer has first and second opposite sides 140, 142, and a set of conductive elements 114 at the first side 140 of the interposer. As used in this disclosure with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate.

The conductive elements 114 can include contacts at a surface of the first side 140, such contacts configured to face and be joined with corresponding contacts 124 of the microelectronic elements 110, 112, such as through bumps of an electrically conductive bond material, such as for example, tin, indium, solder, a eutectic, or an electrically conductive matrix material. In one example, two or more such microelectronic elements 110, 112 each of which is electrically interconnected with the interposer 100 can also be interconnected with one another through wiring provided on the interposer. Although not shown, the electrical connections between the component and one or more microelectronic elements 110, 112 need not be limited only to the above-described flip-chip mounting arrangement. For example, without limitation, and alternatively or in addition to such connections, the electrical connections can include wire bonds, metal-to-metal joints, or connections to micropillars (conductive posts or metal posts) projecting from the first side 140 of the component or from a corresponding surface of the microelectronic element that faces toward the first side 140.

As further shown in FIG. 2A, a microelectronic element 110 or 112 may be a packaged or unpackaged semiconductor chip. Each microelectronic element may comprise a single semiconductor chip, for example, such as microelectronic element 110 or may comprise a plurality of semiconductor chips which are assembled and electrically connected with one another such as the arrangement of stacked chips shown in microelectronic element 112.

As further seen in FIG. 2A, the interposer may have a plurality of terminals 102 at a second side 142 of the interposer 100. In a particular example, the terminals 102 may have joining elements 104 attached thereto. In one example, the joining elements may comprise an electrically conductive bond material, which may be for example, a bond metal such as tin, indium, solder, a eutectic, or a paste including electrically conductive particles. The terminals 102 can be of a type which are configured to face and be joined with a plurality of corresponding contacts of a second component external to the interposer 100. For example, in the assembly 125 seen in FIG. 2A, the terminals 102 may face corresponding contacts 134 on a circuit panel 120 or other component, to which such terminals 102 are joined. For example, as shown assembled in FIG. 2A, each terminal 102 may face and be joined with a corresponding contact 134 through a joining element 104. The joining of the terminals 102 with the contacts 134 can be performed in one example by heating the assembly to a temperature at which a metal of the joining elements 104 fuses to the contacts 134, which then results in the joints between the terminals 102 of the interposer and the corresponding contacts 134 of the circuit panel.

Referring again to FIG. 1, the component or interposer 100 includes a first element 150 comprising a low coefficient of thermal expansion (hereinafter, "CTE) material, i.e., a material having a CTE of less than 10 parts per million per degree Celsius (hereinafter, "ppm/° C."). The first element may have a first surface 152 that is coincident with or adjacent to the first side 140 of the component, and a second surface 154 opposite the first surface, i.e., facing in an opposite direction away from the first surface. In some specific examples, the first element can be made of semiconductor material, glass, or liquid crystal polymer.

In one example, the first element can include semiconductor material, e.g., in form of a semiconductor layer, wherein the second surface of the first element is a surface of the semiconductor material or semiconductor layer, and the first element has dielectric material overlying the semiconductor layer. In an example, the first element 150 can have a compound structure of a low CTE region, e.g., a layer of semiconductor, glass, ceramic or liquid crystal polymer, among others, and further have one or a plurality of dielectric layers between the first surface of the first element and a surface of the low CTE region. In one example, the first element can have one or more dielectric layers existing between a second surface of the first element opposite the first surface and a surface of the low CTE region. In addition, in one example, one or more wiring layers can be insulated from a semiconductor region of the low CTE region by the one or more dielectric layers. The first element may have a maximum thickness 156 between the first surface 152 and the second surface 154 thereof in a vertical direction orthogonal to the first side 140 of the interposer which in some examples can be 100 micrometers or less. In a particular example, the maximum thickness 156 can be less than ten micrometers, and in some cases, can be less than five micrometers.

As further shown in FIG. 1, a second element 160 is coupled to the second surface 154 of the first element 150, wherein the second element has a surface 162 that is coincident with or adjacent the second side 142 of the component. In one example, the second element comprises a second material different from the first material. For example, the first element may comprise a layer of first material such as a semiconductor material or glass, with one or more dielectric layers overlying the layer of first material, and electrically conductive structure such as metal wiring lines and vias providing electrically conductive paths through the one or more dielectric layers and the layer of first material.

In one example, the maximum thickness 156 of the first element in the first direction 180 from the first surface 152 of the first element 150 to the second surface 154 of the first element can be less than a minimum thickness 161 of the second element 160 in the first direction 180 from the second surface of the first element to the second side 142 of the interposer.

Figure 2B:
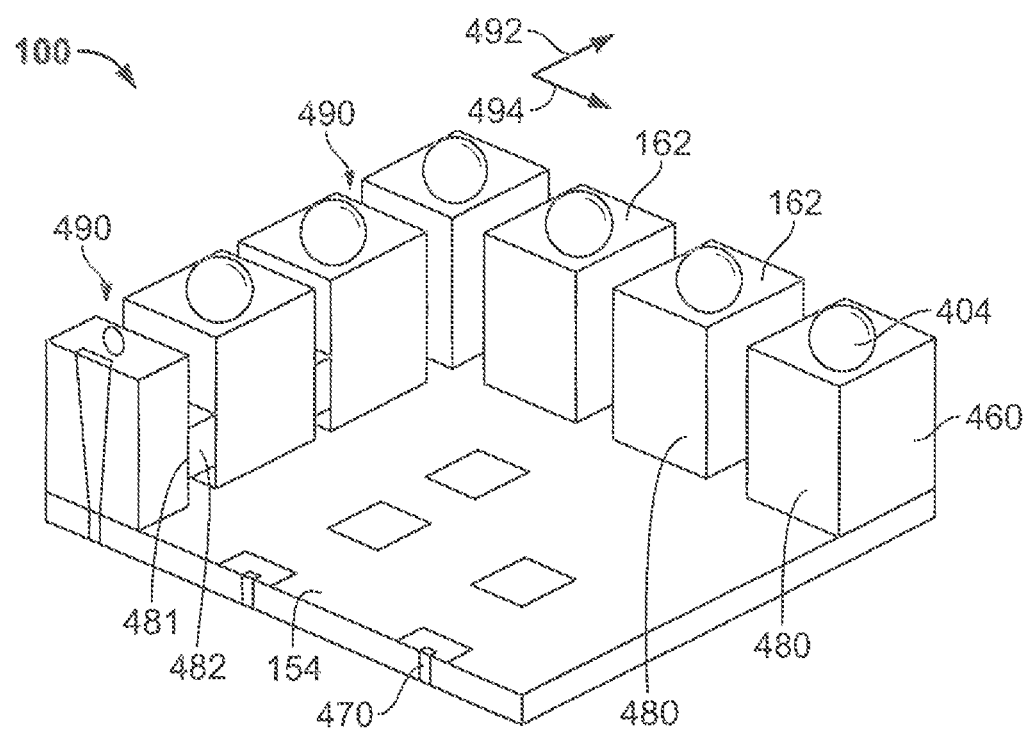
FIG. 2B depicts a sectional view of a second element according to one or more aspects of the disclosure.

Referring to FIGS. 1 and 2B, the second element 160 comprises a plurality of insulated structures 480, the insulated structures being at least partially separated from one another by at least one gap 490 that extends from the surface 162 of the second element towards the first element, or specifically, the second surface 154 of the first element 150. Gaps 490 are typically filled with an electrically insulating material 491 which may be a compliant material. In specific examples, the insulating material 491 may be an elastomer such as a silicone, a spin-on-glass, a positive tone photoresist, or a specific type of silicone such as polydimethylsiloxane (PDMS).

The electrically conductive interconnects 166 can be formed, e.g., using a metal liner, or a fill metal can be provided in the openings 164 extending through the insulated structures. The interconnects can be part of electrically conductive structure which electrically connects the terminals 102 with the contacts 114 or other conductive elements electrically conductive vias 170. In examples, the conductive interconnects can be formed by one or more of depositing a metal or other conductive material within the openings 164 such as by vapor deposition, one or more of electroless or electrolytic plating, or printing, e.g., by directing a jet of electrically conductive ink or screening or stenciling an uncured conductive composition onto at least areas in the openings. In some examples, in addition to a primary conductive layer, the conductive interconnects 166 may include one or more layers of metal formed within the openings 164 as a conductive seed layer, for improving adhesion, or in some cases as a barrier to the diffusion of ions. One or more of such layer or layers, when present, can be formed by one or more of vapor or aqueous deposition, e.g., electroless or electrolytic plating, or by printing, for example.

The conductive interconnects 166 may line the openings 164, or may partially or fully fill the openings. In examples where the conductive interconnects 166 only line the openings 164 or otherwise do not completely fill the openings, a dielectric material 168 can overlie the conductive interconnects 166 within the openings 164. In some examples, the dielectric material 168 may help to insulate the conductive interconnects from other such conductive interconnects, provide a barrier to moisture, or facilitate quicker or more efficient fabrication of the component. The conductive structure can include metalized vias 170 which extend in a direction of a thickness of the low CTE element, and the metalized vias can be as further described below. The metalized vias 170 in some cases may be connected with the conductive elements 114 through one or more wiring layers 153 formed in or on one or more dielectric layers of the first element atop a surface of the low CTE region as described above. Although only one via 170 appears connected to each conductive interconnect 166 in the various sectional views provided, it is understand that each conductive interconnect can be connected to a plurality of conductive vias 170, which in turn connect with the one or more wiring layers 153. In addition, some conductive interconnects 166 may not be connected with any via 170, and therefore may not be connected with the one or more wiring layers 153. Also, some vias 170 may not be connected with any conductive interconnect and therefore may not be connected with any terminal 102 of the component.

In particular examples, the vias 170 can include one or more metals such copper, nickel, aluminum, tungsten, titanium, or palladium, or alloys of such metals, among others. In a particular example, electrically conductive pads 172 can be provided at the second surface of the first element, such pads being electrically connected with or in direct contact with the metalized vias 170. The pads 172 may be formed of the same metal or metals or may be formed of a metal different than a metal of which the vias 170 are formed. In one example, the component 100 can have a structure in which the vias 170 and pads 172 are formed prior to forming or assembling the second element 160 atop the second surface 154 of the first element 150. In a particular example, such vias 170 can be formed according to a "via first" or "via middle" process, as further described below. In such example, at least some of the pads can be aligned with at least one of the openings 164 or with at least one of the gaps in the second element or can be aligned with at least one of the gaps and with at least one of the openings in the second element, and the conductive interconnects 166 can include a conductive material deposited within openings 164 onto the conductive pads 172, e.g., by one or more of vapor or aqueous deposition or printing, among others. In one example, structure, the conductive interconnects 166 can include a conductive material such as solder, a conductive paste or a conductive matrix material, such as can be flowed within at least one of: one or more of the openings or one or more of the gaps onto the conductive pads or onto an electrically conductive layer previously deposited onto the conductive pads. Further description of processes for fabricating the component or interposer is provided below.

In another example, the component 100 can have a structure in which the vias 170 are formed after the conductive interconnects 166 have already been formed extending within the openings 164 of the second element. In one example, the vias can be referred to as "via last" structures, such as when the vias are formed only after other structure such as active or passive circuit elements (or both such types of circuit elements) are formed on first element 150. In either case, the pads 172 can be omitted in some cases, as will be described further in the description of fabricating the component or interposer provided below. In accordance with this example, the vias 170 extending within the first element can be formed to contact existing conductive material in the openings 164, e.g., to contact existing conductive interconnects 166 formed prior to forming the vias 170. The vias 170 in this case extend in the first direction 180 of the first element away from the existing conductive interconnects 166.

In one example, the second element can be an overmold layer which can be formed by molding an encapsulant material, e.g., a potting compound, onto the second surface of the first element. In one example, the second element can be otherwise formed of an encapsulant formed on the second surface of the first element. In a particular example, the second element can be a particulate composite layer which includes a polymeric matrix and particulate loading within the polymeric matrix. Such composite layer can be formed, for example by depositing an uncured polymeric material which has the particulate loading material therein onto the second surface 154 of the first element, the particulate loading material optionally being a dielectric material having a low coefficient of thermal expansion ("CTE"). In one example, the second element can be a structure including a dielectric material that is laminated with the first element. For example, the structure can be a build-up structure which includes one or more layers of polymeric dielectric material, which may or may not include additional reinforcing structure such as glass mesh and/or filler material such as glass or ceramic dielectric filler or semiconductor filler among others. In a particular example, the structure can include one or more layers of ceramic dielectric material. In one example, the second element can include a photoimageable material such as benzocyclobutane (BCB), of which in one example, the openings 164 can be formed by photolithographic patterning.

In accordance with one embodiment, second element 460 can have a structure as illustrated in FIG. 2B. In this example, the second element 460 has a plurality of gaps 490 that extend from the surface 162 of the second element towards the second surface 154 of the first element. The gaps 490 at least partially separate respective insulated structures 480 of the second element from one another in at least a first direction 494 that is parallel to the second surface 154. In the particular embodiment illustrated in FIG. 2B, the gaps 490 separate the respective areas of the second element which are adjacent to each gap in the first direction 494. The gaps 490 also separate the respective areas of the second element which are adjacent to each gap in a second direction 492, the second direction 492 extending parallel to the second surface 154 and transverse to the first direction 494. FIG. 2B further shows joining elements 404 which are suitable for joining terminals 102 (FIG. 1) of the component to another component such as a circuit panel, for example. These terminals, to which the joining elements 404 are joined, can be electrically interconnected with the first element in the manner as described above for terminals 102 (FIG. 1).

The gaps can provide advantageous thermal performance in an assembly as shown, for example, in FIG. 2A in which terminals 102 of the component 100 are connected, e.g., through joining elements 104 to contacts 134 of a substrate 106 which may be a circuit panel or one of a variety of components. Specifically, the gaps 490 between the respective insulated structures 480 of the second element seen in FIG. 2B can reduce an amount of mechanical stress in the connections between the terminals 102 and substrate 106 such as caused by differential thermal expansion. Thus, as used herein, a statement that the gaps lend the connections between the terminals of an insulating element such as the "second element" and a substrate "reduced stress" means that in the operation of an assembly including the component 100 and substrate 106 connected thereto such as through joining elements 104 (FIG. 2A), the connections are subject to appreciably reduced mechanical stress relative to an insulating element which does not have such gaps, such mechanical stress as applied to the connections caused by differential thermal expansion between the substrate and the component or between the substrate and one or more of chip 110, 112.

In an embodiment, the reduction in the stress applied to the connections such as by differential thermal expansion between the substrate 106 and one or more of component 100 and the chip 110, 112 can be more than 50%. In particular examples, the reduction in the stress can be more than threefold, or in some cases more than ten-fold.

As seen in FIG. 2B, in one example, the respective insulated structures 480 may be arranged as a plurality of islands, each island fully separated from each other island by one or more of the plurality of gaps 490. In this regard, adjacent islands may not directly contact one another. In one example, the islands may have a substantially rectangular cross-section as viewed in a first direction 494. As further seen in FIG. 2B, surfaces of the respective separated insulated structures 480 at the surface 162 of the second element can be coplanar. These surfaces which face downwardly in FIG. 1 from surface 162 of component toward substrate 106 may have rectangular, square, polygonal, circular, oval or other shape.

At least some of the gaps 490 may have a via 470 aligned therewith. The vias 470 may provide a connection between the second element 460 and another element, such as a BEOL element. In some examples, the vias 470 may be formed in an alternating arrangement such that gaps 490 adjacent to a gap 490 having a via 470 disposed therein themselves do not have a via 470. In other examples, the vias 470 may have formed in any number or configuration of gaps 490.

Figure 2C:
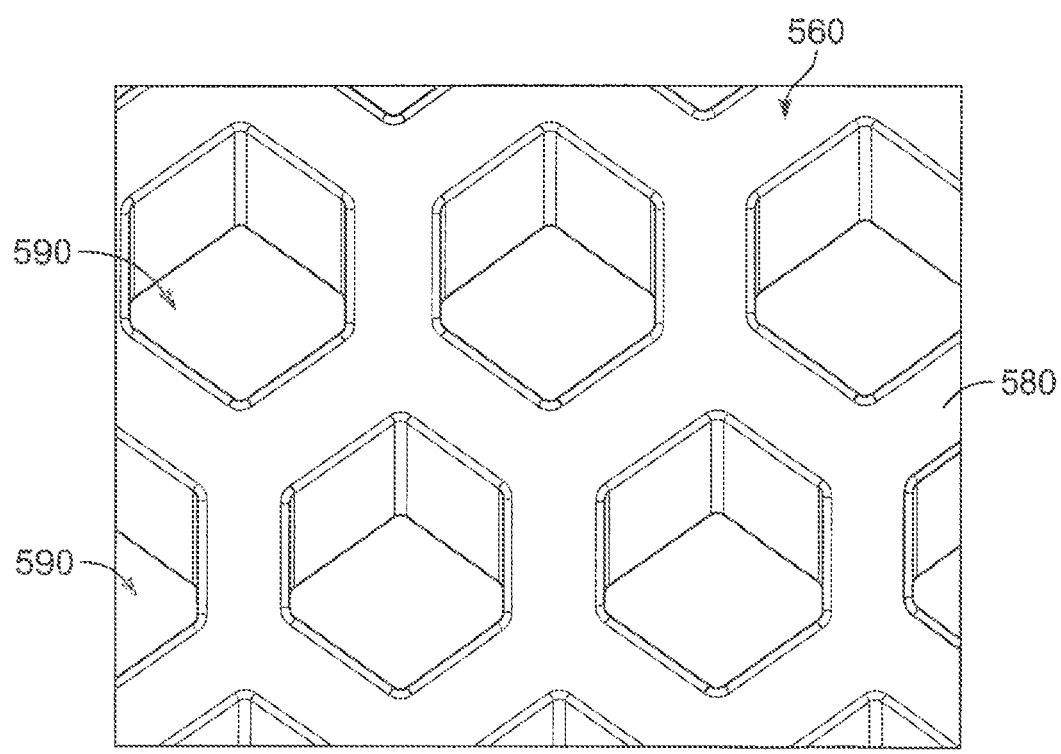
FIG. 2C depicts a bottom view of a second element according to one or more aspects of the disclosure.

In one example as seen in FIG. 2C, at least a portion of the second element 560 may comprise a continuous portion that has a plurality of the insulated structures 580 which are separated by gaps 590 but which nevertheless are integral with the continuous portion, and the insulated structures 580 together with the gaps define a tessellated pattern. In one example, the tessellated pattern can comprise a continuous honeycomb pattern wherein the gaps can be hexagonal in shape and the respective insulated structures of a second element surround the gaps in the first and second directions. In another example, the tessellated pattern can be a grid pattern where the gaps occupy spaces between intersecting grid lines extending in the first direction 494 and in the second direction 492.

In another example, a plurality of insulated structures 580 of the second element 560 may be configured such that they are connected together where adjacent to one another. As shown in FIG. 2C, adjacent insulated structures 580 may at least partially enclose at least one of the plurality of gaps 590. For example, the adjacent insulated structures 580 may form a geometric shape with respect to the at least partially enclosed gap 590. As shown in FIG. 2C, the adjacent insulated structures 580 may form a honeycomb pattern. In other examples, the adjacent areas may form other shapes, such as a grid, e.g., lattice.

In one embodiment, the respective insulated structures 480, 580 can be formed at least partly of a negative tone photoresist or other photoimageable material. For example, a negative tone photoresist such as commonly referred to as "SU8" can be applied to second surface 154 of the first element and then photolithographically exposed in areas where the respective insulated structures 480 are to remain in the final assembly. The photoresist image then is developed which results in the areas which were not exposed by the photolithographic source then being removed, leaving the pattern of respective insulated structures 480 and gaps 490 as shown in FIG. 2B. Alternatively, a photoresist image can be formed by exposing a developing a negative tone photoresist material on the second surface 154 to form a continuous pattern which may be tessellated as described relative to FIG. 2C.

Figure 3A:
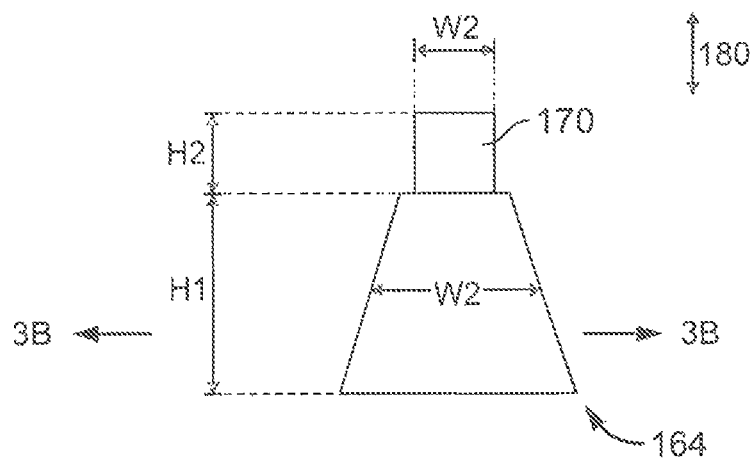
FIG. 3A is a sectional view illustrating relative heights and widths defining aspect ratios of a via and an opening in a component according to an embodiment of the invention.
Figures 3B, 3C:
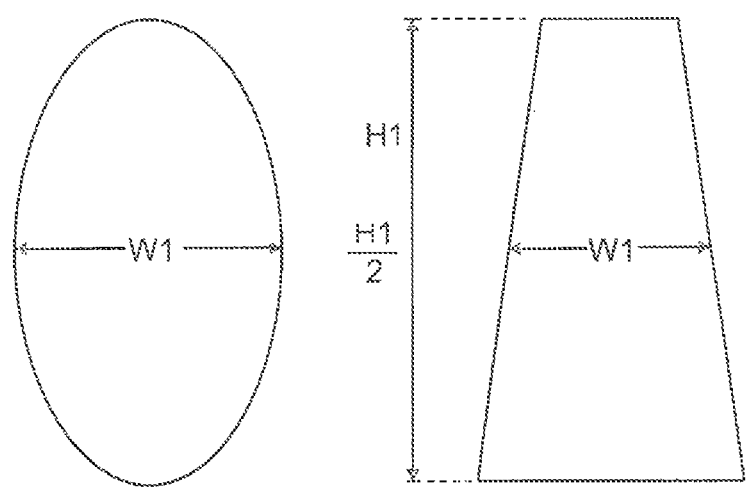
FIG. 3B is a plan view through line 3B-3B of FIG. 3A illustrating a minimum dimension of a via or opening in a horizontal direction transverse to a vertical direction of a height of the via and opening.
FIG. 3C is a further sectional view illustrating a dimension of a via or opening as determined at a midpoint H1/2 of a height H1 of such via or opening.

In one example, the aspect ratios of the openings in the second element can be different from, for example greater than, the aspect ratios of the metalized vias in the first element. For example, as shown in FIGS. 3A, 3B and 3C, a ratio of a height H1 of the opening 164 in a first, vertical direction (direction 180 of a thickness of the first element—see FIG. 1) relative to the minimum dimension W1 at a midpoint of a height H1 in a second, horizontal direction defines a first maximum aspect ratio of the opening 164 through which the conductive interconnect extends. Similarly, a ratio of a height H2 of the via 170 in a first, vertical direction (direction of the thickness) of the second element relative to the minimum dimension W2 at the midpoint of the height of via 170 in a second, horizontal direction orthogonal to the first direction defines an aspect ratio of the via. In a particular embodiment, with the aspect ratios of these structures as defined above, the aspect ratio of the opening 164 in the second element can be greater than the aspect ratio of the via 170 in the first element.

In still another embodiment, adjacent ones of the insulated structures can be connected with one another by connector elements 482 which extend between the edges 481 of adjacent insulated structures 480 as seen in FIG. 2B. In such embodiment, the connector elements 482 can have different, typically smaller, cross-sectional area than the cross-sectional area of the adjacent insulated structures connected thereby.

Figure 4:
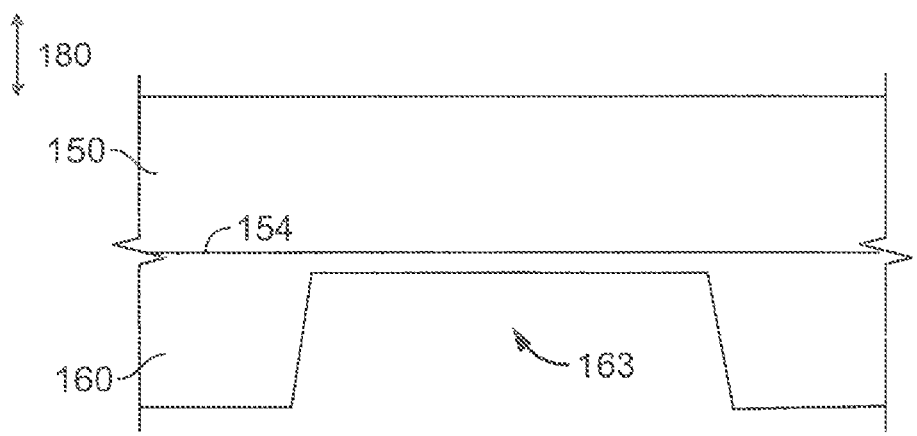
FIG. 4 illustrates a stage in a method of fabrication according to a first embodiment of the invention.

Referring to FIG. 4, a method of fabricating the component 100 according to one embodiment will now be described. A method of fabricating an interposer according to a first embodiment will now be described in which vias (not shown) are formed after the conductive interconnects (not shown) are formed. Later, a method of forming an interposer will be described in which the vias are formed before the conductive interconnects.

As seen in FIG. 4, a first element 150 is shown which in its initial state, can be formed of low CTE material, i.e., a material having a CTE less than 10 ppm/° C. such as one or more of semiconductor, glass, ceramic or liquid crystal polymer material. A second element 160 can be formed or assembled with the first element 150 such that the second element overlies a second surface 154 of the first element. In a particular embodiment, the second element 160 can be formed by molding an encapsulation layer onto the second surface 154. In a particular embodiment, the molding of the encapsulation layer can include forming one or more cavities 163, which may be the same as or different from the openings 164 (FIG. 1) in which the conductive interconnects 166 (FIG. 1) extend as described above. For example, a chase of the mold used to form the second element can include corresponding structure which defines the location, shape and size (i.e., height in first direction 180, and width and length in directions parallel to second surface) of the cavities 163. In a particular example, the chase-defined cavities may be the openings 164 or portions of the openings. In another example, the chase-defined cavities can be gaps 490 or portions of gaps as described above. In still another example, the chase-defined cavities can be both the openings and the cavities. Such mold-defined cavities 163 in some cases may not extend to the second surface 154 of the first element, and hence may need to be post-processed in order to further extend the openings in a direction towards the first element, such as to expose conductive pads on the first element, as will be further described below.

Figure 5:
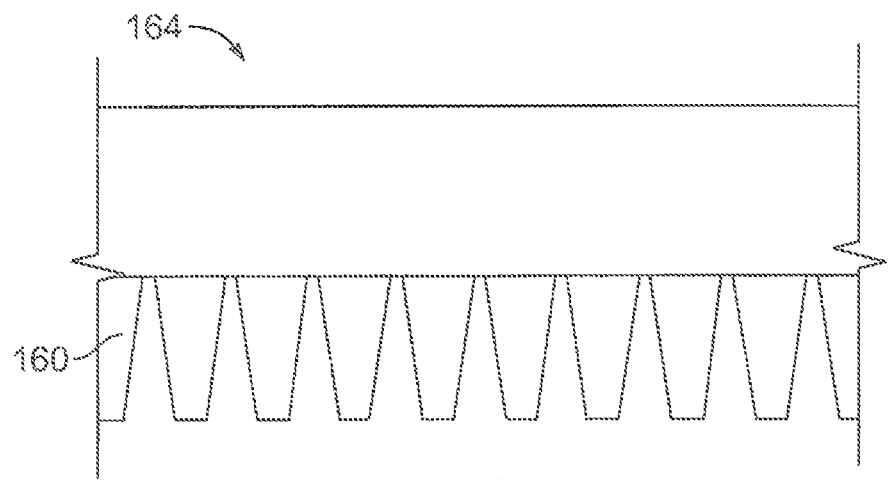
FIG. 5 illustrates a stage in a method of fabrication according to a first embodiment of the invention.

FIG. 5 illustrates a stage of processing in which apertures such as openings 164 (or gaps 490) or both can extend through the second element. Gaps can be as described above relative to FIG. 2B or FIG. 2C. The apertures can be partially or fully defined by the molding process as described above. In another example, a structure can be formed in which an in-process insulating element overlies a second surface of the first element, and then the openings 164, gaps or both openings and gaps can be formed after forming the second element, such as by etching, punching, mechanical or laser ablation, milling, directing a stream of abrasive material or particles thereto (which can be referred to as "wetblasting" or "sandblasting") or other removal technique.

Figure 6:
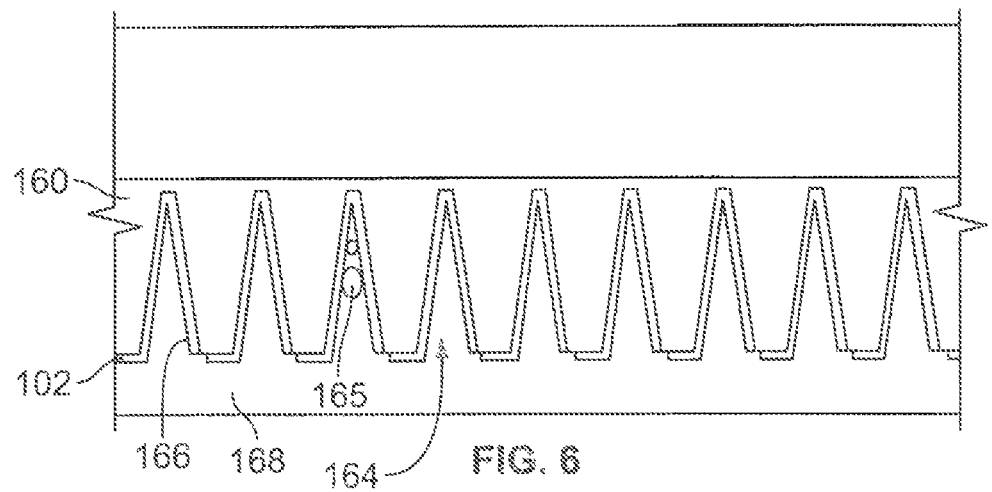
FIG. 6 illustrates a stage in a method of fabrication according to a first embodiment of the invention.

Thereafter, as seen in FIG. 6, conductive interconnects 166 are formed within the openings 164, which can include formation of terminals 102 at a surface of the second element 160. The conductive interconnects can be formed, for example, as described above relative to FIGS. 1-2.

At this time, a dielectric material 168 can be deposited to overlie the conductive interconnects 166 and may also overlie the terminals 102. In one example, the dielectric material can be the same as the dielectric material of the final component, such dielectric material being subsequently etched back or partially removed to the areas of the dielectric material 168 (FIGS. 1-2) remaining in the final component. In one example, as seen in FIG. 6, voids 165 may exist within the openings or within the dielectric material 168, the voids being evacuated or gas-filled spaces which are enclosed within the volume of the openings and, which in some cases may be enclosed within the dielectric material 168. In one example, such voids may help to reduce an effective dielectric constant K of the dielectric material 168.

Figure 7:
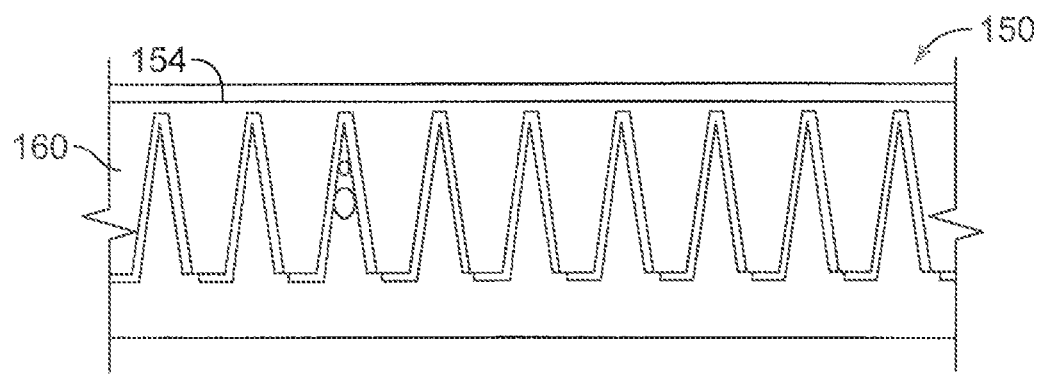
FIG. 7 illustrates a stage in a method of fabrication according to a first embodiment of the invention.

Thereafter, as seen in FIG. 7, the first element 150 can be abraded from a surface opposite the surface 154 that is adjacent to the second element 160. This process reduces a thickness of the first element from an initial thickness to a reduced thickness. In some examples, the reduced thickness may be less than 100 micrometers, and in some cases less than 10 micrometers, or in yet another example, may be less than five micrometers. The abrading of the first element can be performed, for example, by a process such as any one or more of lapping, grinding or polishing.

Figure 8:
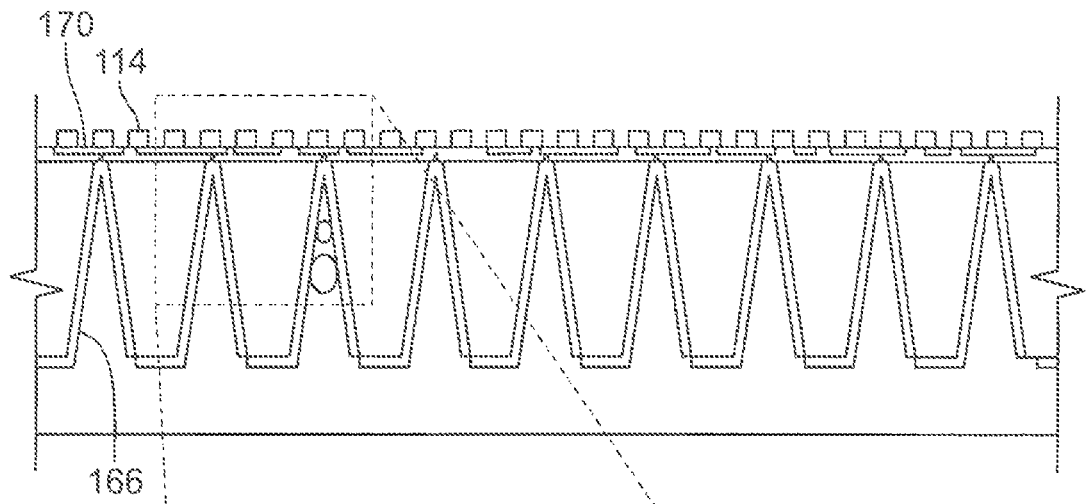
FIG. 8 illustrates a stage in a method of fabrication according to a first embodiment of the invention.
Figure 9:
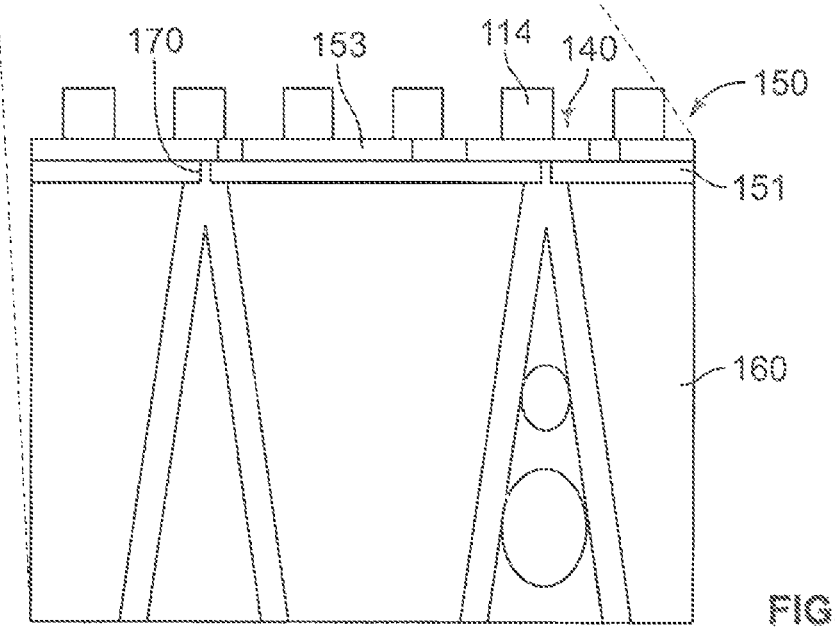
FIG. 9 illustrates a stage in a method of fabrication according to a first embodiment of the invention.

As further seen in FIG. 8, conductive structure can be formed on and within the first element, the conductive structure including the vias 170 and conductive elements 114 electrically connected with the conductive interconnects 166. FIG. 9 provides an enlarged view thereof, showing vias 170 extending through a low CTE layer 151 of the first element and electrically connected with conductive contacts 114, e.g., conductive pads 114 through one or more metal layers, e.g., wiring layers 153, disposed in one or more dielectric layers overlying the low CTE layer between the first side 140 of the interposer and the second element 160. The vias can be formed extending through the low CTE layer to portions of the conductive interconnects 166 disposed within the openings 164.

In a particular example, when the low CTE layer is formed of semiconductor material, the process of forming the vias 170 can include etching openings extending through the low CTE layer, then lining the openings with a dielectric material, e.g., by depositing a dielectric material on walls and bottoms of such openings, and then removing dielectric material at the bottoms of such openings, e.g., by etching, to permit the vias to be formed in contact with the conductive interconnects 166. Thereafter, further processing can be performed to form the one or more dielectric layers and wiring layers on or in the dielectric layers to form contacts 114 at a surface of the first element 150 which are electrically connected with the vias 170.

Next, a method will now be described for fabricating a component, e.g., interposer, according to a variation of the above-described method. In this variation, the method will be described for fabricating the component according to a method in which vias 170 (FIG. 11) and conductive pads 172 are provided on the first element 150 prior to forming or assembling the second element 160 with the first element.

In one example, the vias 170 can be "via first" structures in which the vias are formed prior to other processing by which active or passive circuit elements or both types are formed in active semiconductor regions of the first element. In this example, the vias typically are formed of material which is capable of withstanding high temperatures (typically ranging to temperatures above 850° C., and often higher) at which semiconductor devices can be formed in a semiconductor region of the first element. For example, vias capable of withstanding such temperatures can be formed of metals such as titanium, tungsten, titanium-tungsten, electrically conductive compounds of titanium, tungsten, tantalum, or any combination of the foregoing. Alternatively, vias can be formed of doped polycrystalline semiconductor material such as polysilicon, alone or in combination with one or more of the aforementioned conductive materials.

In another example, the vias 170 can be "via middle" structures. In this variation, the vias 170 would be formed after forming the active or passive circuit elements in the first element, but before proceeding with further processing as shown below. In this variation, the metalized vias 170 are referred to as "via middle" structures because they will be formed after high temperature processing steps needed to form the active or passive circuit elements. In such variation, the vias 170 can be formed of a metal such as copper, nickel, aluminum or palladium.

Figure 10:
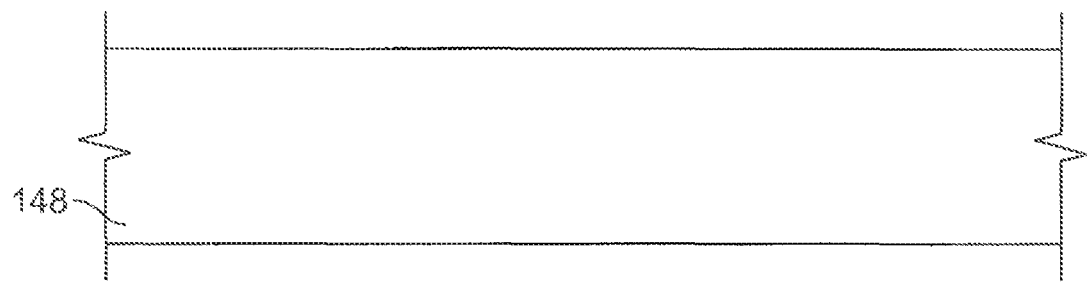
FIG. 10 illustrates a stage in a method of fabrication according to a second embodiment of the invention.
Figure 11:
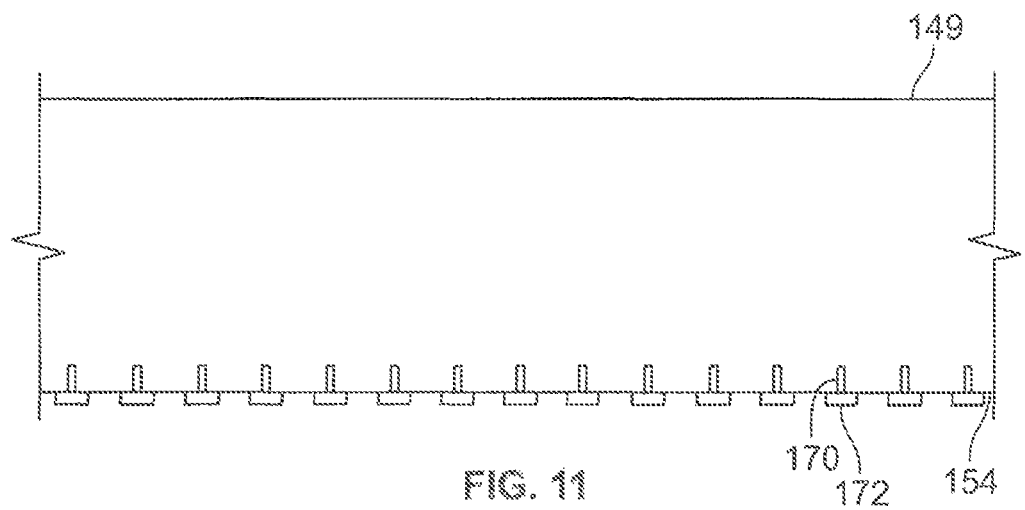
FIG. 11 illustrates a stage in a method of fabrication according to a second embodiment of the invention.

Accordingly, starting with a low CTE element 148 such as described above as shown in FIG. 10, a method of fabricating the component is described. As shown in FIG. 11, a plurality of conductive pads 172 and conductive vias 170 connected with the vias can be formed which extend from the second surface 154 of the first element inwardly towards a surface 149 opposite thereto. In one example, the pads 172, the vias 170 or both the pads and the vias can be formed by depositing a metal such as copper, aluminum, nickel, palladium or other metal or combination of metals on the first element, such as by vapor deposition, electroless or electrolytic plating or combination of such deposition methods.

In an appropriate case, a conductive material such as a conductive matrix material can be used to form the conductive pads, vias or both the pads and the vias. Typically, the pads 172 and vias 170 are formed on dielectric insulating material of the first element by steps including depositing or electrolessly plating a conductive seed layer and electrolytically plating additional metal thereon which will form the vias and pads. In a particular example, the pads can be coated with a barrier metal, e.g., electroless palladium or a nickel-Palladium alloy, among other possible coatings. In one example, the barrier metal can be used to limit or avoid interactions between an underlying metal of the pads and solder or other conductive metal which may subsequently contact the pads 172 as conductive interconnects 166 extending within the openings 164 in the second element, as seen in FIG. 15.

Figure 12:
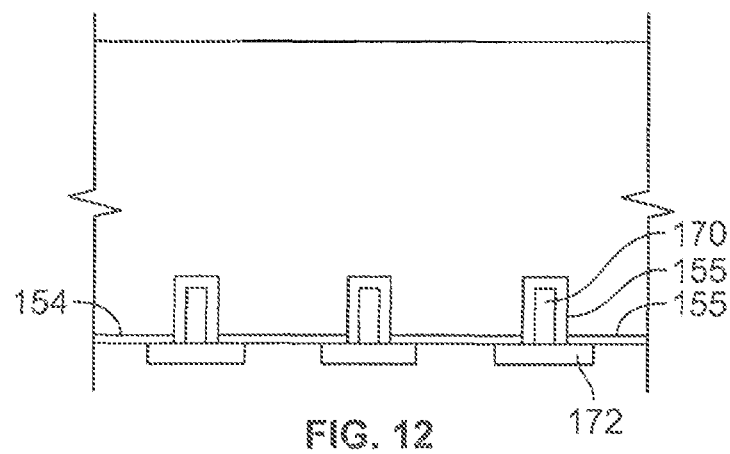
FIG. 12 illustrates a stage in a method of fabrication according to a second embodiment of the invention.

As illustrated in FIG. 12, the pads 172 can be insulated from one another by a dielectric layer 155 overlying the second surface 154 of the first element, and the vias 170 may extend through a dielectric layer 155 and insulated from the surrounding low CTE material of the first element by a dielectric layer lining the vias 170, particularly if the low CTE material is a semiconductor region. Alternatively, when the first element is formed of dielectric material or otherwise insulating material between adjacent conductive vias and adjacent conductive pads 172, the dielectric layer 155 and the dielectric layer lining the vias 170 can be omitted.

Figure 13:
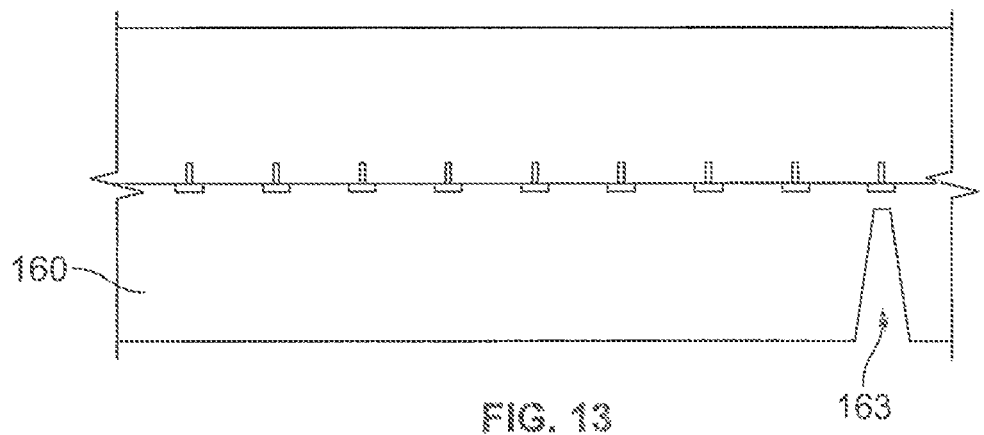
FIG. 13 illustrates a stage in a method of fabrication according to a second embodiment of the invention.
Figure 14:
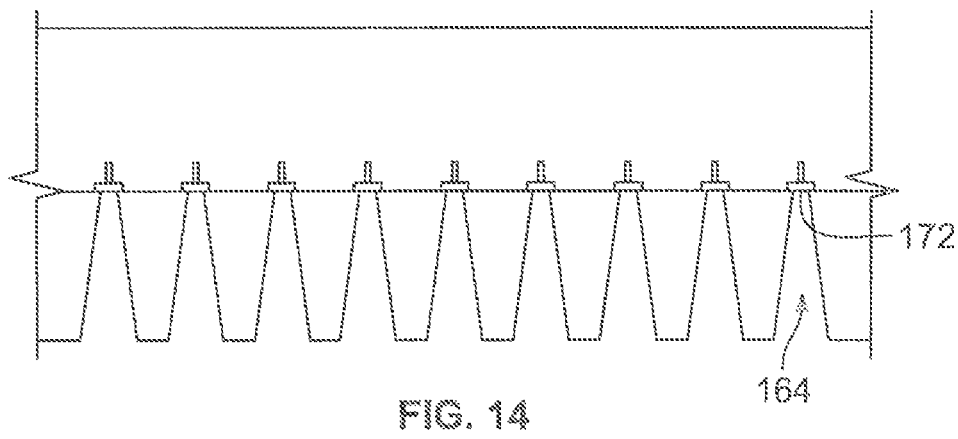
FIG. 14 illustrates a stage in a method of fabrication according to a second embodiment of the invention.
Figure 15:
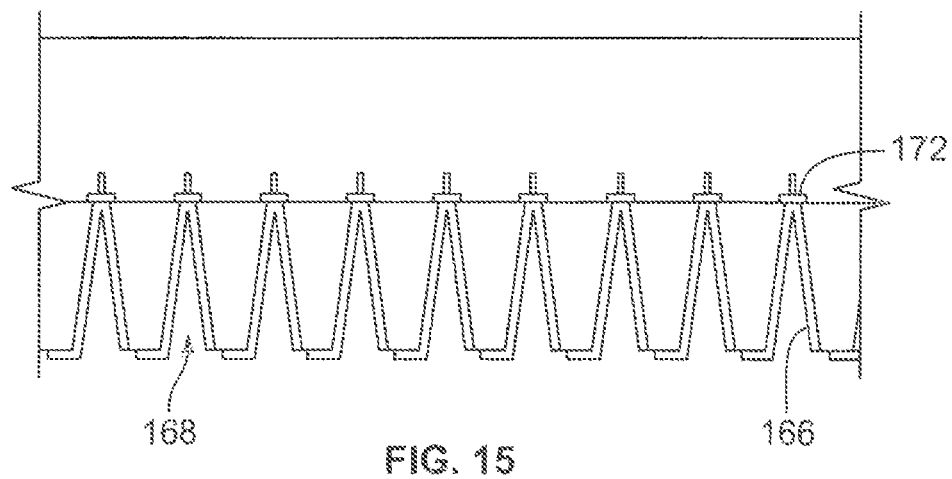
FIG. 15 illustrates a stage in a method of fabrication according to a second embodiment of the invention.

Next, as illustrated in FIGS. 13, 14 and 15, processing can proceed in a manner as described above with respect to FIGS. 4, 5 and 6, with the exception that when the forming of the openings 164 is complete, the conductive pads 172 (FIG. 14) are at least partially aligned with the openings 164 and can have surfaces at least partially exposed within the openings and conductive interconnects 166 (FIG. 15) are coupled to the conductive pads by a conductive material, e.g., a metal deposited onto at least portions of surfaces of the pads exposed within the openings. In one example, as seen in FIG. 13, openings 163 can be optionally formed during the molding process which extend partially through the second element 160. The openings 163 can then be extended by subsequent processing to form openings 164 (FIG. 14) through which surfaces of pads 172 are at least partially exposed. The conductive interconnects 166 can be formed by plating or otherwise depositing conductive material within the openings in contact with at least portions of surfaces of the pads 172. Thereafter, a dielectric material 168 (FIG. 15) can be deposited to at least partially cover the conductive interconnects 166, such as described above with reference to FIG. 6.

Figure 16:
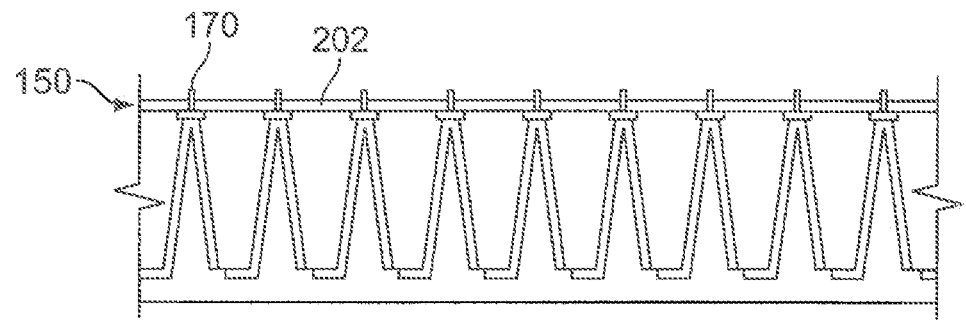
FIG. 16 illustrates a stage in a method of fabrication according to a second embodiment of the invention.

Referring to FIG. 16, processing can then continue with the abrading of the first element 150 to reduce its thickness, as described above. In a particular example, the first element 150 can be reduced until the vias 170 are almost exposed at the abraded surface 202, and then a subsequent processing, e.g., etching can be performed to reveal the dielectric material lining the vias 170, and a metal of which the vias are formed, which may be, for example, one or more of copper, nickel, aluminum, tungsten, titanium, or palladium, or alloys of such metals, among others.

Figure 17:
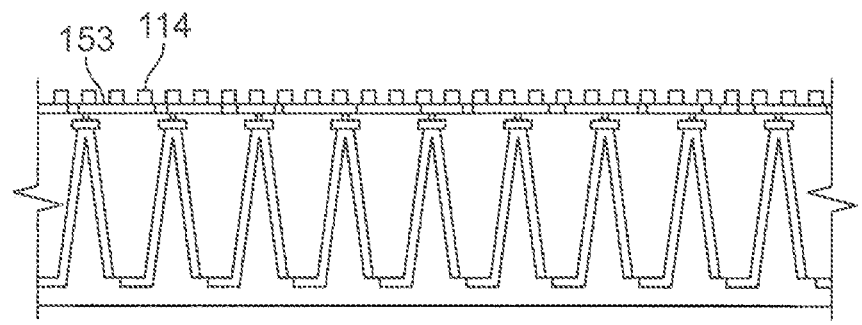
FIG. 17 illustrates a stage in a method of fabrication according to a second embodiment of the invention.
Figure 18:
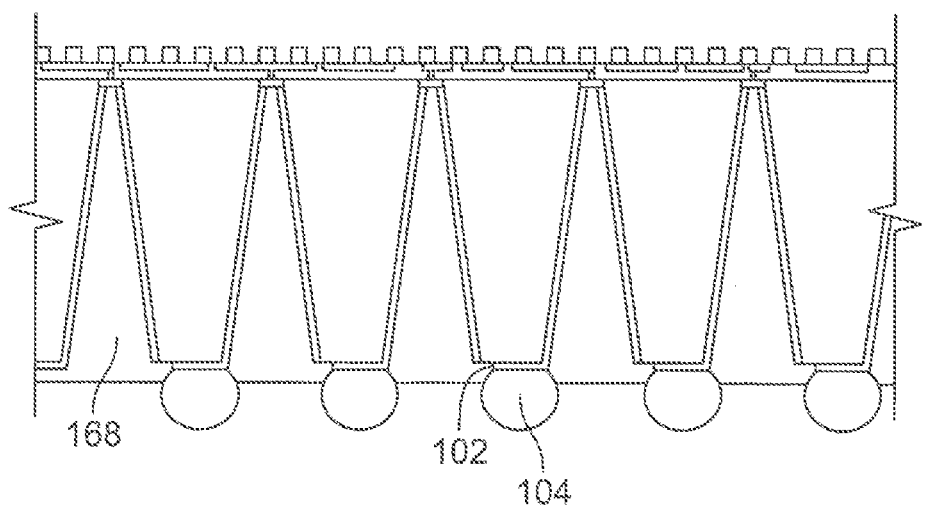
FIG. 18 illustrates a stage in a method of fabrication according to a second embodiment of the invention.

Thereafter, referring to FIGS. 17-18, processing can be continued to form one or more dielectric layers, and one or more wiring layers 153 within such dielectric layers, and conductive contacts 114, e.g., conductive pads of the interposer, such as described above with reference to FIGS. 8 and 9. As seen in FIG. 18, portions of the dielectric material 168 can be removed to expose terminals 102 and optionally, joining elements 104, e.g., solder balls, can be applied or joined to the terminals.

Figure 19:
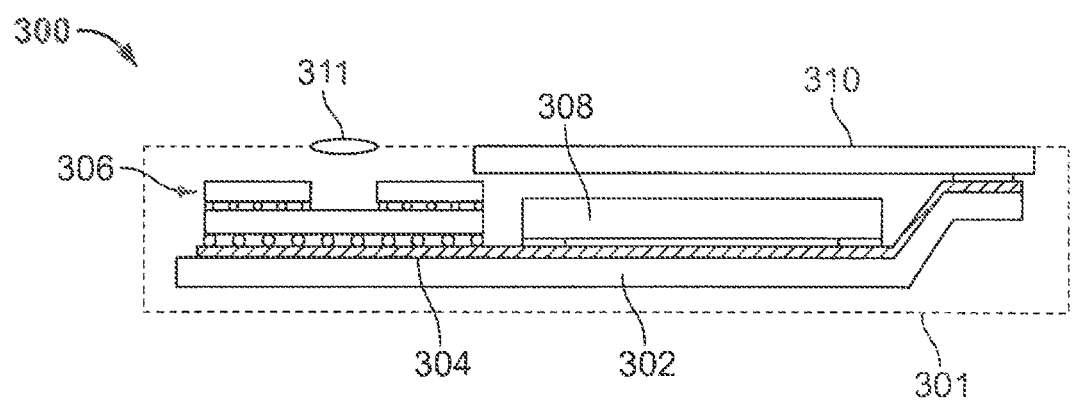
FIG. 19 depicts a system according to an embodiment of the invention.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 300 in accordance with a further embodiment of the invention includes a structure 306 as described above in conjunction with other electronic components 308 and 310. In the example depicted, component 308 is a semiconductor chip whereas component 310 is a display screen, but any other components can be used. Of course, although only two additional components are depicted in FIG. 19 for clarity of illustration, the system may include any number of such components. The structure 306 as described above may be, for example, a microelectronic assembly as discussed above in connection with FIG. 1 or FIG. 2. Structure 306 and components 308 and 310 are mounted in a common housing 301, schematically depicted in broken lines, and are electrically interconnected with one another as necessary to form the desired circuit. In the exemplary system shown, the system includes a circuit panel 302 such as a flexible printed circuit board, and the circuit panel includes numerous conductors 304, of which only one is depicted in FIG. 19, interconnecting the components with one another. However, this is merely exemplary; any suitable structure for making electrical connections can be used. The housing 301 is depicted as a portable housing of the type usable, for example, in a cellular telephone or personal digital assistant, and screen 310 is exposed at the surface of the housing. Where structure 306 includes a light-sensitive element such as an imaging chip, a lens 311 or other optical device also may be provided for routing light to the structure. Again, the simplified system shown in FIG. 19 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of the preferred embodiments should be taken by way of illustration rather than by way of limitation of the invention as defined by the claims.

What is claimed is:

1. A method of fabricating a component having first and second opposite sides, the method comprising:
   forming a structure comprising
      a first element having a first surface coincident with or adjacent to the first side, and a second surface opposite the first surface, the first element comprising a material having a coefficient of thermal expansion of less than 10 ppm/° C.,
      a second element having a surface coincident with or adjacent to the second side, the second element being coupled to the second surface of the first element,
      a plurality of conductive elements at the first side,
      wherein the second element comprises electrically insulated structures formed of at least one second material different from the first material, each of the insulated structures at least partially separated from on another by at least one gap extending from the surface of the second element towards the first element, and
   forming a plurality of terminals at the second side configured for connection with a plurality of corresponding contacts of a another component external to the component, and electrically conductive structure configured to electrically couple the plurality of terminals with the conductive elements, the conductive structure including at least one electrically conductive interconnect extending through at least one of the insulated structures towards the first element
   wherein the forming of the structure includes molding a material comprising a dielectric material to define the insulated structures separated by the at least one gap.

2. The method of claim 1, wherein the forming of the structure includes photolithographically patterning a photoimageable material, the patterned material defining the respective insulated structures which are separated by the at least one gap.

* * * * *